US011444114B2

United States Patent
Huang et al.

(10) Patent No.: US 11,444,114 B2
(45) Date of Patent: Sep. 13, 2022

(54) IMAGE DETECTOR WITH PHOTOSENSITIVE PIXEL ARRAY

(71) Applicant: IRAY TECHNOLOGY COMPANY LIMITED, Shanghai (CN)

(72) Inventors: Zhongshou Huang, Shanghai (CN); Tieer Gu, Shanghai (CN)

(73) Assignee: IRAY TECHNOLOGY COMPANY LIMITED, Shanghai (CN)

( * ) Notice: Subject to any disclaimer, the term of this patent is extended or adjusted under 35 U.S.C. 154(b) by 188 days.

(21) Appl. No.: 16/987,645

(22) Filed: Aug. 7, 2020

(65) Prior Publication Data

US 2021/0225915 A1    Jul. 22, 2021

(30) Foreign Application Priority Data

Jan. 21, 2020  (CN) .......................... 202010072653.6

(51) Int. Cl.
| | |
|---|---|
| *H01L 27/146* | (2006.01) |
| *H04N 5/3745* | (2011.01) |
| *G06V 40/13* | (2022.01) |
| *H01L 27/32* | (2006.01) |

(52) U.S. Cl.
CPC ........ *H01L 27/14623* (2013.01); *G06V 40/13* (2022.01); *H01L 27/14627* (2013.01); *H04N 5/37457* (2013.01); *H01L 27/14663* (2013.01); *H01L 27/14678* (2013.01); *H01L 27/3234* (2013.01)

(58) Field of Classification Search
CPC ......... H01L 27/14623; H01L 27/14627; H01L 27/14663; H01L 27/14678; H01L 27/3234; H01L 27/14625; G06V 40/13; G06V 40/1318; H04N 5/37457; H04N 5/374
See application file for complete search history.

(56) References Cited

U.S. PATENT DOCUMENTS

| | | | |
|---|---|---|---|
| 2013/0120760 A1 | 5/2013 | Raguin et al. | |
| 2016/0266695 A1* | 9/2016 | Bae | .................... G06V 40/1318 |
| 2019/0319059 A1* | 10/2019 | Wu | .................... H01L 27/14603 |
| 2020/0410201 A1* | 12/2020 | Nilsson | .................... G02B 27/30 |
| 2021/0134868 A1* | 5/2021 | Tsujio | ............... H01L 27/14625 |

FOREIGN PATENT DOCUMENTS

WO    WO 2019/035629 A1    2/2019

OTHER PUBLICATIONS

European Search Report dated Mar. 24, 2021 in EP 20197392.2.

* cited by examiner

*Primary Examiner* — Gevell V Selby
(74) *Attorney, Agent, or Firm* — W&G Law Group (57) ABSTRACT

An image detector comprises a plurality of photosensitive pixels that each pixel includes a photoelectric conversion layer and a light shielding layer overlapped each other. A plurality of openings are made on the light shielding layer in a manner that its light passing area is substantially proportional to a distance from the opening to a border of the pixel.

10 Claims, 7 Drawing Sheets

IMAGE DETECTOR WITH PHOTOSENSITIVE PIXEL ARRAY

CROSS-REFERENCE TO RELATED APPLICATIONS

The present application is based upon and claims the benefit of priority of Chinese Patent Application No. 202010072653.6, filed on Jan. 21, 2020, the entire contents of which is incorporated herein by reference.

TECHNICAL FIELD

Embodiments of the present disclosure pertain generally to the field of detectors, and more particularly, to the field of image detectors.

BACKGROUND

The image detectors detect an external shape or an internal structure of an object through energy radiation from the object. This radiation either comes from the object itself or an external radiation source via penetration through or reflection from the object. Since the external surface shape and internal structure of the object will modify a spatial distribution of the radiation, the spatial distribution of the radiation modified by the object will carry image information of the surface or internal structure of the object, such that the external shape or internal structure of the object can be obtained by converting the radiation distribution into electrical image signals.

For example, a flat panel radiation image detector is one of the image detectors widely used in digital radiography for medical diagnosis and radiotherapy. The flat panel radiation image detectors, based on their detection principles and structures, can be roughly classified into two categories, i.e., direct conversion type and indirect conversion type. The indirect conversion detector mainly includes a radiation conversion layer and an optical image detector. The radiation conversion layer converts radiation into visible light, and the optical image detector acquires an image signal. The optical image detector includes multiple photoelectric conversion devices. For each light photon received, an electron hole pair may be generated inside the photoelectric conversion device. The electron hole pair is separated by an electric field, then the separated electron and the hole are collected by anode and cathode of the photoelectric conversion device, respectively. An electrical image signal is then sent to an external circuit, for realizing image detection.

In indirect conversion detectors, photons of visible light converted from radiation will be emitted isotropically in all directions. Among those photons emitted, the photons emitted in large angles are likely to diffuse laterally so that a blurred image is produced instead of a sharp image duplicated from an original radiation image. In other words, large angle light traces may be absorbed by the photoelectric conversion device departing from its original position after a long path of lateral diffusion, which does not contribute to the image signal but causes a reduction in a spatial resolution or a contrast of the image, thereby reducing the image quality.

Other image detectors, such as fingerprint image sensors, also have similar drawbacks. In operating fingerprint acquisition, a light source illuminates uniformly the fingerprint with many irregular ridges and valleys, while a fingerprint image sensor collects reflecting light from the fingerprint surface. Light reflected back from the fingerprint surface will emit in all directions according those irregular ridges. Therefore, light reflected from a point on a fingerprint may finally reach a broad range pixels of the fingerprint image sensor, causing crosstalk or blurring in image and reducing the resolution of the resultant fingerprint image.

Therefore, it is a primary object of present invention to provide an image detector that reduces lateral diffusion of light and then produces sharper images with less blurring and cross-talk.

SUMMARY

The image detector includes a pixel array including a plurality of photosensitive pixels. Each of the plurality of photosensitive pixels includes a photoelectric conversion layer configured to convert incident light into signal charges; and a light shielding layer positioned above light incident surface of the photoelectric conversion layer and comprising a plurality of openings to pass the incident light to the photoelectric conversion layer. Each of the plurality of openings has its light-passing area substantially proportional to a distance from the opening to a border of the photosensitive pixel.

In the present disclosure, incident light first passes through the light shielding layer and then reaches the photoelectric conversion layer, and light traces emitted in larger angles with respect to the center of the opening of the light shielding layer are blocked by a light shielding portion of the light shielding layer and thus cannot reach the photoelectric conversion layer. Therefore, the light shielding layer can block large angle light traces and light expected to enter other neighboring pixels is less likely enters the photoelectric conversion layer of the photosensitive pixel, thereby reducing crosstalk or blurring, improving image resolution, and improving image quality. In addition, the closer to the edge of the photosensitive pixel is, the smaller the opening is. That is, the openings in a photosensitive pixel become smaller and smaller from the center to the edge of the photosensitive pixel. Since the probability of receiving incident light emitted in large angles from adjacent photosensitive pixels is higher at the position closer to the edge of the photosensitive pixel, the size of the opening is varied with the change of the distance between the opening and the edge of the photosensitive pixel. The relatively smaller opening near the edge can effectively reduce the crosstalk or blurring, and the relatively larger opening near the center allows the central area to receive more light, thereby improving the signal-to-noise ratio of the image.

BRIEF DESCRIPTION OF DRAWINGS

These and other features, aspects, and advantages of the present disclosure will become better understood when the following description is read with reference to the accompanying drawings in which like characters represent like parts throughout the drawings, wherein.

DESCRIPTION OF EMBODIMENTS

In order to make the features, aspects and advantages of the present disclosure better understood, the technical solutions of the present disclosure will be described in details below with reference to the accompanying drawings. It should be noted that the described embodiments are merely a part of implementations of the present disclosure, rather than all of the implementations or varieties based upon the concept disclosed in the present disclosure. All other embodiments obtained by those skilled in the art without creative efforts according to the embodiments of the present disclosure shall fall within the scope of the present disclosure.

The terms used in the embodiments of the present disclosure is for the purpose of describing particular embodiments only and are not intended to limit the present disclosure. The terms in singular forms "a" "the" and "said" used in the embodiments of the present disclosure and the appended claims are also intended to include plural forms, unless the context clearly indicates other meanings.

Applicant has found the physical factors affecting an image quality after the intensive and in-depth study on the existing technologies.

Figure 1:
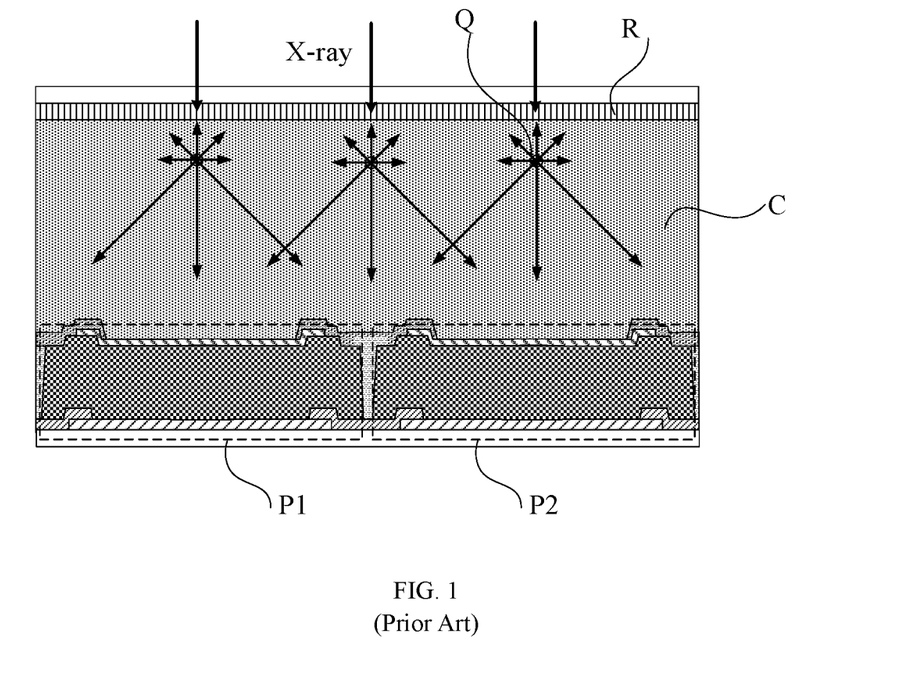
FIG. 1 is a prior art example of a radiation image detector.

FIG. 1 is a cross-sectional view of a prior art of a radiation image detector. FIG. 1 illustrates two photosensitive pixels P1 and P2, a radiation conversion layer C, and a reflective film R. The incident radiation (e.g. X-ray) enters the radiation conversion layer C and generates visible light photons Q through the radiation conversion layer C, and the visible light photons are emitted in all directions isotropically. Those light photons emitted upward to the top reflective film R will be reflected back, and a portion of which may reach to the photosensitive pixel P1, as what happened in those light photons emitted downward originally. However, the visible photons emitted in large angles against the direction of the incident radiation, which is perpendicular to the radiation conversion layer C, may reach to neighboring photosensitive pixel P2, instead of the photosensitive pixel P1 which is right below the point where the visible photons are generated. In other words, light photons diffused in large angle will cause signal crosstalk or image blurring. The larger the diffused angle is, the more serious image blurring occurs. In a worst case, those visible light photons, which are emitted substantially in parallel to the radiation conversion layer, will eventually fade away after suffering multiple scattering and absorptions inside the radiation conversion layer.

Figure 2:
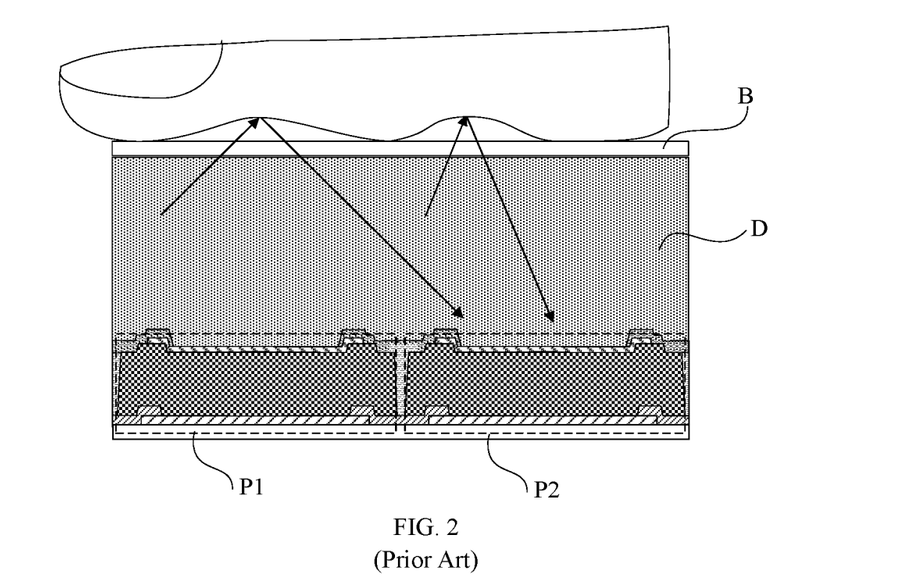
FIG. 2 is a cross-sectional view of a fingerprint identification image detector known in the prior art.

FIG. 2 schematically illustrates a cross-sectional view of a typical fingerprint image detector known in the prior art, wherein P1 and P2 are photosensitive pixels, D is a light source, and B is a transparent substrate. The light source D illuminates uniformly the fingerprint surface characterized by many irregular ridges and valleys. When the finger is pressed on the transparent substrate B, the ridges contact the substrate B directly, while an air gap is created between the valleys and the substrate B. Light reflectivity on an interface of any two materials is proportional to the square of difference between their refractive indexes. Therefore, stronger light reflection can be observed along the valleys of the fingerprint, while darker lines can be observed along the ridges of the fingerprint. In this way, the fingerprint image formed by the reflected light exhibits bright stripes along the valleys and dark stripes along the ridge. The fingerprint image is then formed by alternated bright and dark stripes.

However, light is reflected by the ridges and valleys on the fingerprint to various directions or in various angles. As illustrated in FIG. 2, the light reflected by the fingerprint right above the photosensitive pixel P1 on the left may reach to the neighboring photosensitive pixel P2 or vice versa, or even a photosensitive pixel far away from P1, resulting signal crosstalk or image blurring.

Through the above analysis, it is understood that, no matter what kind of image detector, a lateral light diffusion above the image detector will inevitably cause signal crosstalk or image blurring, or in a more precise technical term, reduction in spatial modulation transfer function (MTF) of the acquired image.

It is therefore a primary object of this invention to provide solutions to prevent the light emitted in large angle from reaching to the image detector, and increase MTF of acquired images.

Figure 3:
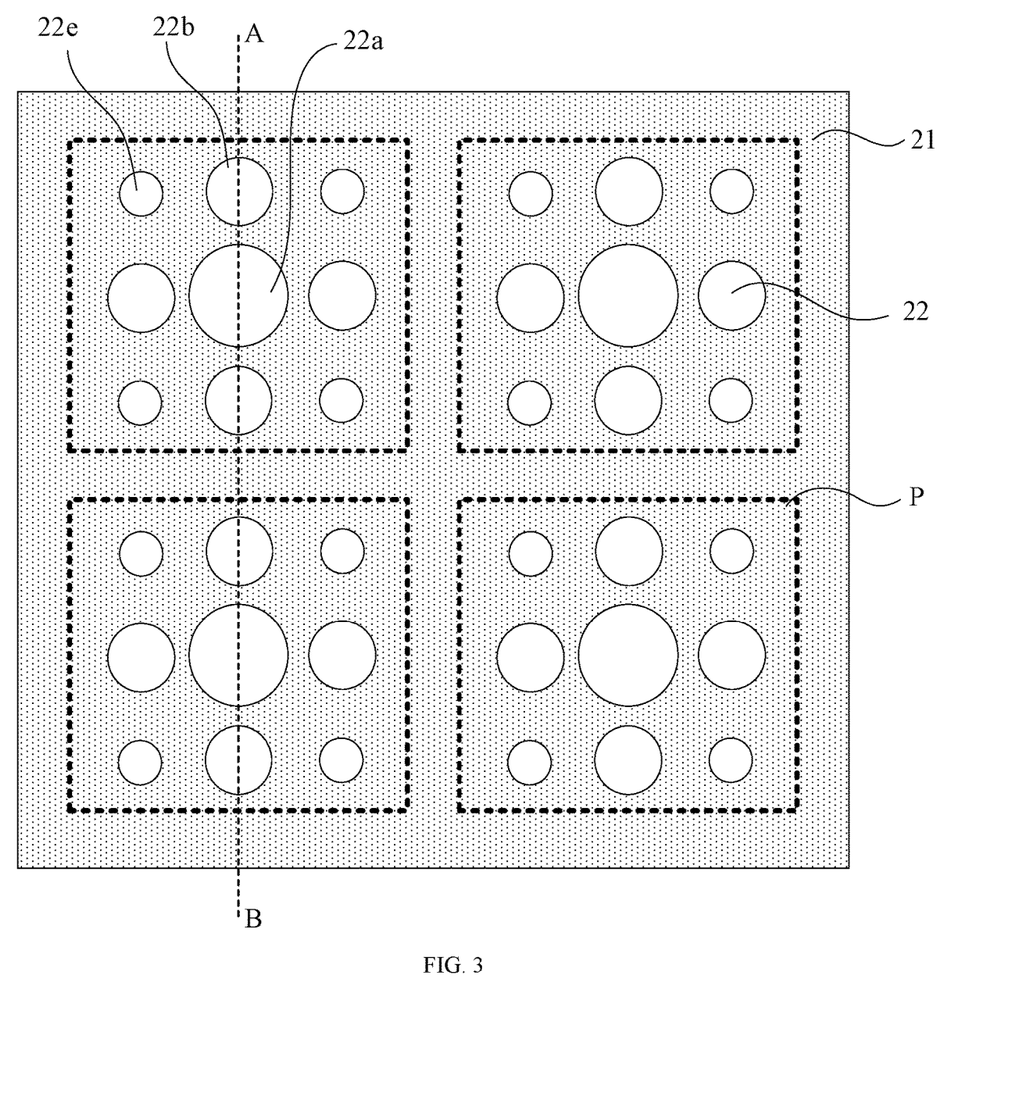
FIG. 3 is a schematic illustrating an image detector provided in an embodiment of the present disclosure.
Figure 4:
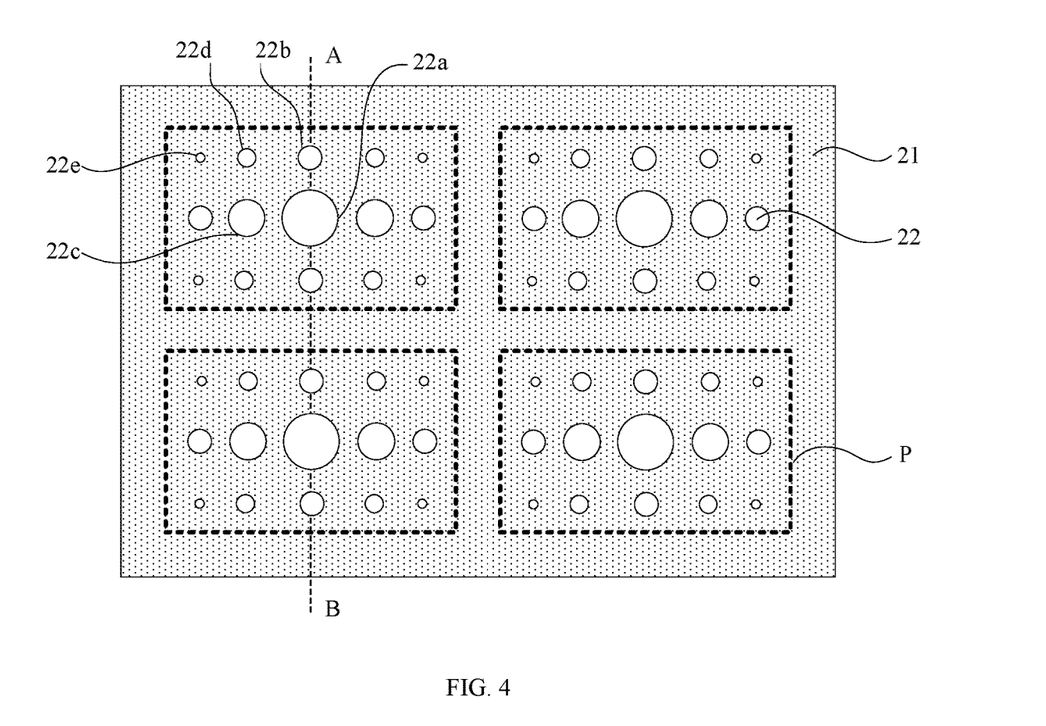
FIG. 4 is a schematic illustrating an image detector provided in an embodiment of the present disclosure.
Figure 5:
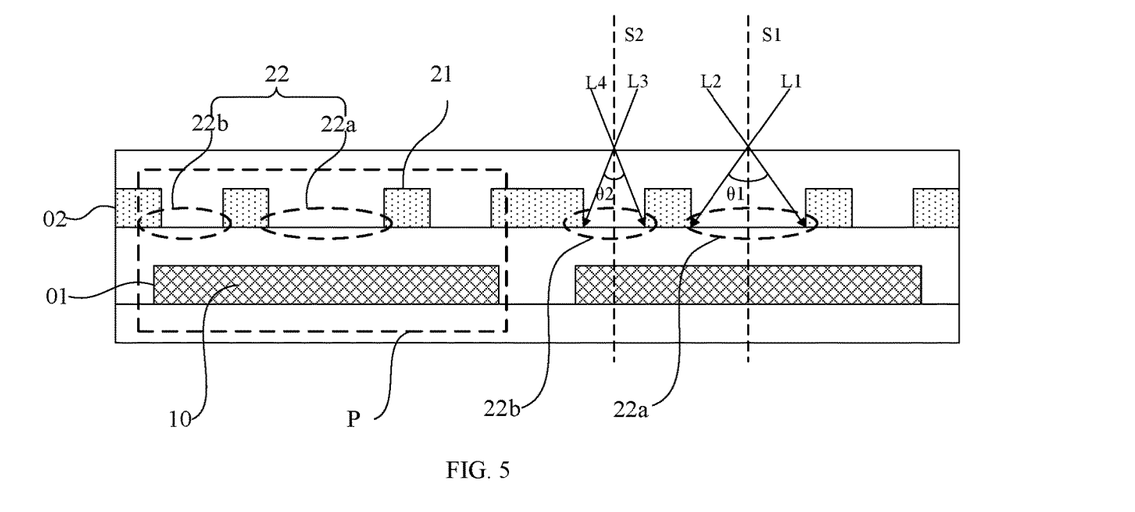
FIG. 5 is a cross-sectional view of the image detector along a direction AB shown in FIG. 3 or FIG. 4.

FIG. 3 is a schematic illustrating an image detector provided in an embodiment of the present disclosure, FIG. 4 is a schematic illustrating an image detector provided in an embodiment of the present disclosure, and FIG. 5 is a cross-sectional view of the image detector along a direction AB shown in FIG. 3 or FIG. 4.

As shown in FIG. 3 and FIG. 4, the image detector provided by the embodiment of the present disclosure includes a pixel array including multiple photosensitive pixels P. That is, the pixel array includes a plurality of photosensitive pixels P. In addition, adjacent photosensitive pixels P are isolated from one another by etching, insulating film, or other manner, so as to prevent a signal crosstalk between different photosensitive pixels P and interference noise of driving pulses.

Referring to FIG. 5, the photosensitive pixel P includes a photoelectric conversion layer 01 and a light shielding layer 02.

The photoelectric conversion layer 01 is configured to convert incident light into signal charges. In an embodiment, the photoelectric conversion layer 01 includes a photodiode 10, and the photodiode includes a first electrode, a first doped layer, a photoelectric conversion layer, a second doped layer, and a second electrode that are sequentially stacked. If the first electrode is an anode and the first doped layer is a p-type doped layer, the second electrode is a cathode and the second doped layer is an n-type doped layer. If the first electrode is a cathode and the first doped layer is an n-type doped layer, the second electrode is an anode and the second doped layer is a p-type doped layer correspondingly.

The light shielding layer 02 is disposed at a side of the photoelectric conversion layer 01 close to a light incident surface, and the light incident surface is a surface of the image detector where all incident light first passes through when the incident light enters the image detector. Moreover, the light shielding layer 02 includes a light shielding portion 21 and a plurality of openings 22, center lines S1 and S2 of the openings 22 are perpendicular to the photoelectric conversion layer 01, and the openings are configured to allow a part of the incident light to pass and to be transmitted to the photoelectric conversion layer 01. As shown in FIG. 5, incident light L1 and incident light L2 that are close to the center line S1 can reach a corresponding photoelectric conversion layer 01 through the opening 22a, and incident light L3 and incident light L4 that are close the center line S2 can reach a corresponding photoelectric conversion layer 01 through the opening 22b. Incident light away from the center line S1 is blocked by the light shielding portion 21 and cannot reach the photoelectric conversion layer 01 through the opening 22a, and incident light away from the center line S2 is blocked by the light shielding portion 21 and cannot reach the photoelectric conversion layer 01 through the opening 22b. In other words, the light shielding portion 21 of the light shielding layer 02 cooperates with the openings 22 to allow the light traces emitted in small angles with respect to the center lines S1 and S2 to pass and prohibit the light traces emitted in large angles with respect to the center lines S1 and S2 to pass. In short, the openings 22 of the light shielding layer 02 merely allow the incident light emitted in an angle within a certain range against the center lines of the openings.

In addition, as shown in FIG. 3, FIG. 4 and FIG. 5, for the openings 22 of the light shielding layer 02 corresponding to one photosensitive pixel P, a size of the opening 22 is related to a shortest distance between a center of the opening 22 and the edge of the corresponding photosensitive pixel P, and the opening 22 has a smaller size if the shortest distance is smaller. As illustrated in FIG. 5, among the openings 22 corresponding to one photosensitive pixel P, a distance between the center of the opening 22b and the edge of the photosensitive pixel P is smaller than a distance between the center of the opening 22a and the edge of the photosensitive pixel P, and accordingly, the size of the opening 22b is significantly smaller than the size of the opening 22a. It can also be seen from FIG. 5 that a maximum incident angle of incident light passing through the smaller opening 22b is smaller than a maximum incident angle of incident light passing through the larger opening 22a. If it is expressed in a conical light-transmitting solid angle, as shown in FIG. 5, a light-transmitting solid angle θ1 of the opening 22a is greater than a light-transmitting solid angle θ2 of the opening 22b.

In the photosensitive pixel P, the edge of the photosensitive pixel P receives more incident light emitted in large angle from other neighboring photosensitive pixels than the center of the photosensitive pixel P. Therefore, more incident light emitted in large angle from other photosensitive pixels can be blocked by providing the smaller opening 22 close to the edge of the photosensitive pixel P, thereby reducing the signal crosstalk. On the other hand, the opening 22 close to the center of the photosensitive pixel P is larger, so as to block the incident light emitted in large angle while increasing the amount of light passing through the opening 22, thereby improving a signal-to-noise ratio of the image.

In an embodiment, a diameter, an area, or a maximum size of the opening can be measured as the size of the opening. The shape of the opening is generally circular, as shown in FIG. 3 and FIG. 4. However, the present disclosure can also include openings of different shapes, such as ellipse, square or rectangle, or ring-shape. If the opening is not a ring-shaped hole, the size of the opening is determined by the largest one of the geometric dimensions in all directions of the shape of the object. If the opening is a ring-shaped hole, the size of the opening is determined by the largest width of the ring hole.

Further referring to FIG. 3, in a longitudinal direction, if a distance between the opening 22b and an upper edge of the photosensitive pixel P is smaller than a distance between the opening 22a and the upper edge of the photosensitive pixel P, the opening 22b has a smaller diameter than the opening 22a; in a transverse direction, if a distance between an opening 22e and a left edge of the photosensitive pixel P is smaller than a distance between the opening 22b and the left edge of the photosensitive pixel P, the opening 22e has a smaller diameter than the opening 22b. Still referring to FIG. 4, in the longitudinal direction, if the distance between the opening 22b and the upper edge of the photosensitive pixel P is smaller than the distance between the opening 22a and the upper edge of the photosensitive pixel P, the diameter of the opening 22b is smaller than that of the opening 22a; in the transverse direction, if a distance between an opening 22c and the left edge of the photosensitive pixel P is smaller than a distance between the opening 22a and the left edge of the photosensitive pixel P, a diameter of the opening 22c is smaller than that of the opening 22a. It should be noted that, although both the opening 22b and the opening 22c are adjacent to the opening 22a located at the center of the photosensitive pixel P, the distance between the opening 22b and the edge (upper edge) of the photosensitive pixel P is significantly smaller than the distance between the opening 22c and the edge (left edge) of the photosensitive pixel P, such that the diameter of the opening 22b is smaller than the diameter of the opening 22c.

In some optional embodiments, the light shielding layer 02 includes an opaque metal layer, and the metal layer includes a metal chromium layer or a metal chromium layer coated with chromium oxide. The chromium oxide also has a light absorption property, which can avoid that the large angle light traces incident to the light shielding layer are reflected.

Figure 6:
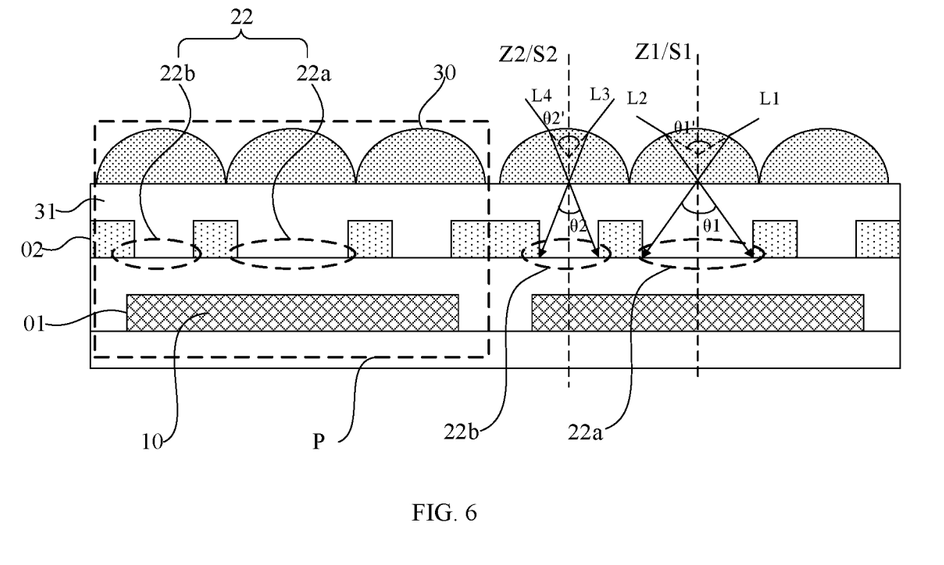
FIG. 6 is a cross-sectional view of an image detector provided in an embodiment of the present disclosure.

FIG. 6 is a cross-sectional view of an image detector provided in an embodiment of the present disclosure. As shown in FIG. 6, the photosensitive pixel P further includes a lens array including convex lenses 30 and positioned above the light incident surface of the light shielding layer 02. Each convex lens 30 is paired with one opening 22, and has its optical axis passing through the paired opening, the optical axis is perpendicular to the photoelectric conversion layer 01 and is also perpendicular to the light shielding layer 02. That is, the incident light is collected by the convex lens 30 and then passes through the light shielding layer 02. As shown in FIG. 6, the incident light within a conical solid angle θ1' is collected by the convex lens 30 corresponding to the opening 22a to turn into the incident light within a conical solid angle θ1, which then reaches the photoelectric conversion layer 01, where θ1'>θ1. The incident light within a conical solid angle θ2' is collected through the convex lens 30 corresponding to the opening 22b to turn into the incident light within a conical solid angle θ2, which then reaches the photoelectric conversion layer 01, where θ2'>θ2. That is, when the incident light allowed to pass through the opening 22a has a maximum incident angle of θ1/2, the maximum incident angle of the incident light L1/L2, which actually passes through the opening 22a after being collected by the convex lens, is increased to θ1'/2. Similarly, the maximum incident angle of the incident light L3/L4, which actually passes through the opening 22b, is increased to θ2'/2. Therefore, under a certain diameter of the opening 22, the amount of incident light incident to the photoelectric conversion layer 01 can be increased by providing the convex lens 30.

In an embodiment of the present disclosure, as shown in FIG. 6, the optical axis of the convex lens 30 and the center line of a corresponding opening 22 coincide. As shown in FIG. 6, the optical axis Z1 of the convex lens 30 corresponding to the opening 22a and the center line S1 of the opening 22a coincide, and the optical axis Z2 of the convex lens 30 corresponding to the opening 22b and the center line S2 of the opening 22a coincides.

Still referring to FIG. 6, the image detector further includes a base layer 31, and the base layer 31 can not only serve as a base for supporting the convex lens 30, but also can flatten a surface of the light shielding layer 02 underneath. The base layer 31 and the convex lens 30 can be made of the same material, or materials with a substantially same refractivity, so as to reduce the reflection when the visible light penetrates the interface of the layer. The base layer 31 can be made of any one of polyimide, polyethylene glycol terephthalate, or acrylic resin.

In a manufacturing process of the convex lens 30, an organic film containing a solvent can be first formed on the light shielding layer 02, and then the solvent in the organic film can be volatilized by heating or UV curing to form the base layer 31. Then, the convex lens 30 is formed on the base layer 31. The convex lens 30 can be formed by an etching process. First, an organic thin film is formed, and the organic thin film is etched to form a stepped structure at a position corresponding to the convex lens 30 to be formed, and then subjected to baking at a high temperature. The edge of the stepped structure is formed in a hemispherical shape by utilizing the softening fluidity of the organic material film, thereby forming the structure of the convex lens. During this manufacturing process, the base layer 31 and the convex lens 30 are manufactured separately. In another manufacturing process, the convex lens 30 and the base layer 31 can be manufactured in one step through a half-gray scale photomask.

It should be noted that the convex lens 30 can have a hemispherical shape as shown in FIG. 6, or other shapes that can increase a collected amount of visible light, for example, the bottom surface thereof is polygon such as square or hexagon. The convex lens 30 having a hexagon bottom surface can construct a lens array similar to a honeycomb structure, which can reduce the light loss at a junction of the lens.

Figure 7:
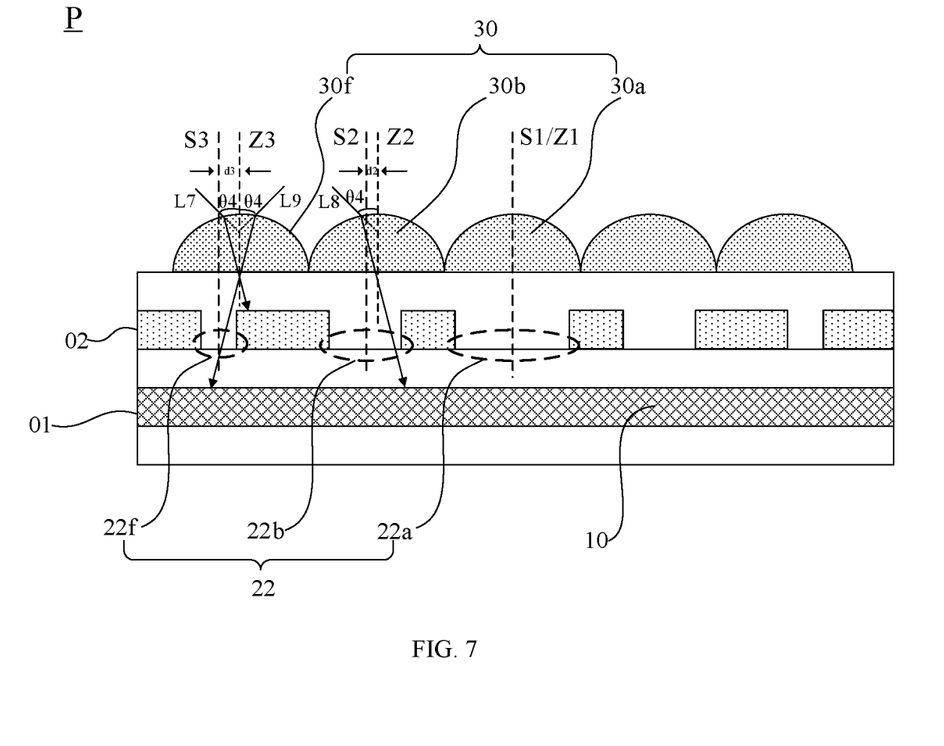
FIG. 7 is a cross-sectional view of an image detector provided in an embodiment of the present disclosure.

FIG. 7 is a cross-sectional view of an image detector provided in an embodiment of the present disclosure. As shown in FIG. 7, the center lines of some openings 22 deviate from the optical axis of the corresponding convex lens 30 to the edge of the photosensitive pixel P. For example, as shown in FIG. 7, the center line S1 of the opening 22a located at the center of the photosensitive pixel P and the optical axis Z1 of the corresponding convex lens 30a coincide, i.e., there is no deviation therebetween. In contrast, the center line S2 of the opening 22b, which is adjacent to the opening 22a and closer to the left edge of the photosensitive pixel P than the opening 22a, deviates from the optical axis Z2 of the corresponding convex lens 30b to the left edge of the photosensitive pixel P, and a deviating distance is d2. The center line S3 of an opening 22f, which is adjacent to the opening 22b and closer to the left edge of the photosensitive pixel P than the opening 22b, deviates from the optical axis Z3 of the corresponding convex lens 30f to the left edge of the photosensitive pixel P, and a deviating distance is d3, where d2<d3. That is, the deviating distance between the center line of the opening 22 and the optical axis of the corresponding convex lens 30 towards the left edge of the photosensitive pixel P is related to the shortest distance between the opening 22 and the edge of the photosensitive pixel P, and the deviating distance increases with the increasing of the shortest distance is.

It can be seen from FIG. 7 that, for the incident radiations L7 and L9 that are incident to the opening 22f in a same incident angle θ4, as the center line S3 of the opening 22f deviates from the optical axis Z3 of the corresponding convex lens 30f to the left edge of the photosensitive pixel P, the incident radiation L7 incident from a left side of the optical axis Z3 is blocked by the light shielding layer 02, and the incident radiation L9 incident from a right side of the optical axis Z3 can pass through the opening 22f of the light shielding layer 02. In addition, for the parallel incident radiations L7 and L8 that respectively fall into the openings 22f and 22b at the same incident angle θ4, as a deviating distance between the center line S3 of the opening 22f and the optical axis Z3 of the corresponding convex lens 30f is greater than a deviating distance between the center line S2 of the opening 22b and the optical axis Z3 of the corresponding convex lens 30b, the incident radiation L7 is blocked by the light shielding layer 02, and the incident radiation L8 can pass through the opening 22b of the light shielding layer 02.

Therefore, when the center line of the opening 22 deviates from the optical axis of the corresponding convex lens 30 to the edge of the photosensitive pixel P, the opening 22 cooperates with the convex lens 30 to more effectively block the large angle light traces that are directly above the adjacent photosensitive pixel and block less light transmitted directly above the corresponding photosensitive pixel P.

In an embodiment of the present disclosure, the light shielding layer 02 of the photosensitive pixel P includes openings 22 arranged in an array, e.g., a 3×3 arrangement as shown in FIG. 3, or a 5×3 arrangement as shown in FIG. 4, and the convex lenses 30 are also arranged in an array, correspondingly.

Figure 8:
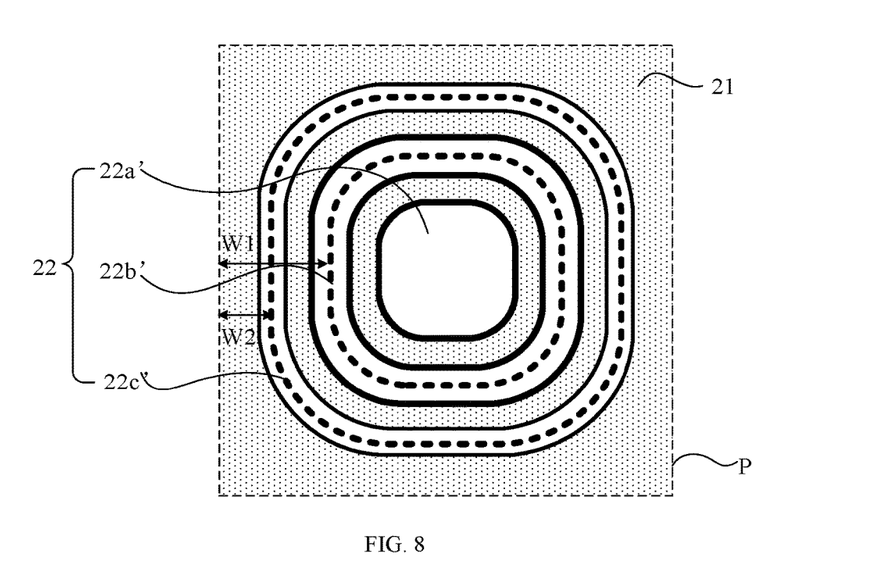
FIG. 8 is a schematic illustrating a light-shielding layer of a photosensitive pixel provided in an embodiment of the present disclosure.

FIG. 8 is a schematic illustrating a light shielding layer of a photosensitive pixel provided in an embodiment of the present disclosure. In an embodiment of the present disclosure, as shown in FIG. 8, the light shielding layer 02 of the photosensitive pixel P includes openings 22 including a central opening 22a' surrounded by at least one ring-shaped opening. FIG. 8 illustrates two ring-shaped openings 22b' and 22c', and the ring-shaped opening 22b' and 22c' surround the central opening 22a'. Correspondingly, the photosensitive pixel P includes convex lenses including a central convex lens surrounded by at least one ring-shaped convex lens.

All openings other than the central opening are the ring-shaped openings, and the ring-shaped openings are arranged in a direction from the edge of the photosensitive pixel to the center of the photosensitive pixel, and the quantity of incident light from other photosensitive pixels incident to this photosensitive pixel decreases in the direction from the edge of the photosensitive pixel to the center of the photosensitive pixel. In this way, the design of the ring-shaped opening can effectively block the incident light from other photosensitive pixels, reduce a total number of openings in the photosensitive pixel, and increase the amount of light that enters the photoelectric conversion layer 01 through the openings. Accordingly, a joining blank gap between the convex lenses is also reduced, and the reflection loss of light in the joining blank gap between the convex lenses is reduced, so that the photoelectric conversion layer can collect more incident light in small angle from above.

In addition, as shown in FIG. 8, a width of the ring-shaped opening is related to a shortest distance between a center of the ring-shaped opening and the edge of the photosensitive pixel P, and the width of the ring-shaped opening decreases with the decreasing of the shortest distance. That is, the ring-shaped opening has a smaller width when it is closer to the edge of the photosensitive pixel. As shown in FIG. 8, a distance W1 between the center of the ring-shaped opening 22$b'$ and the edge of the photosensitive pixel P and a distance W2 between the center of the ring-shaped opening 22$c'$ and the edge of the photosensitive pixel P satisfy W1>W2, and the width of the ring-shaped opening 22$b'$ is greater than the width of the ring-shaped opening 22$c'$. It should be noted that the so-called center of the ring-shaped opening is any a point on a corresponding center line of the ring-shaped opening (i.e., a dashed line in the ring-shaped opening shown in FIG. 8), and the so-called width of the ring-shaped opening is a shortest distance between an inner edge and an outer edge of the ring-shaped opening.

In addition, in an embodiment of the present disclosure, one ring-shaped opening illustrated in FIG. 8 has a constant width, i.e., the ring-shaped opening illustrated in FIG. 8 has a uniform width. However, in another embodiment of the present disclosure, one ring-shaped opening illustrated in FIG. 8 has an inconstant width, for example, the ring-shaped opening is a ring-shaped opening having four corners, and the four corners are narrower than other positions of the ring-shaped opening, and the width between any two corners can vary in such a manner that the width close to the center position is greater than the width close to the edge position.

Figure 9:
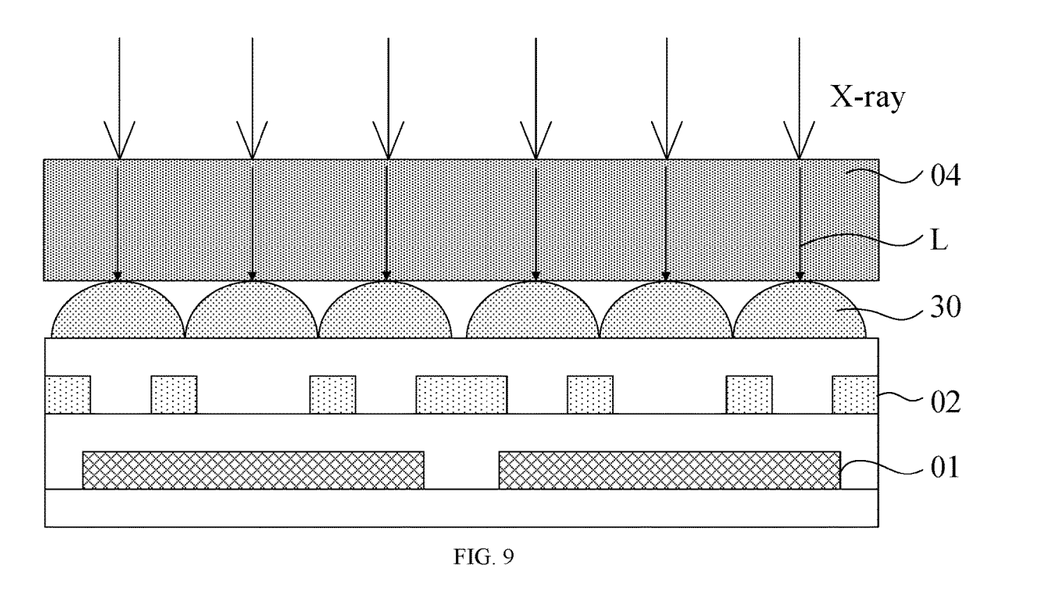
FIG. 9 is a schematic illustrating an image detector provided in an embodiment of the present disclosure.
Figure 10:
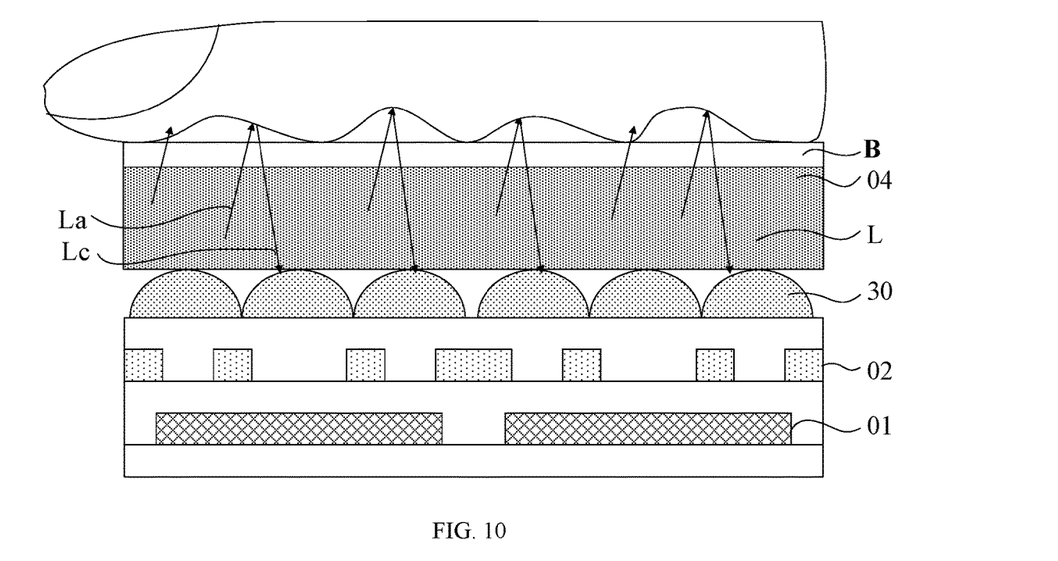
FIG. 10 is a schematic illustrating an image detector provided in an embodiment of the present disclosure.

FIG. 9 is a schematic illustrating an image detector provided in an embodiment of the present disclosure, and FIG. 10 is a schematic illustrating an image detector provided in an embodiment of the present disclosure. As shown in FIG. 9 and FIG. 10, the image detector provided in embodiments of the present disclosure further includes a light emitting panel 04 positioned above a light incident surface of the lens array and configured to provide illumination for the image detector. The incident light L refers to visible light incident to the light shielding layer 02. It should be noted that the light emitting panel 04 can provide the image sensor with the incident light in a direct manner or in an indirect manner.

FIG. 9 illustrates that the light emitting panel 04 directly provides the image sensor with incident light. That is, light emitted by the light emitting panel 04 directly reach the light shielding layer 02 as the incident light L, and at least a part of the incident light L passes through the light shielding layer 02 and reaches the photoelectric conversion layer 01. For example, the light emitting panel 04 includes a radiation conversion layer that can convert radiation into visible light, and the radiation conversion layer includes a scintillator thin film or a scintillator crystal. X-ray carrying image information is incident on the radiation conversion layer to excite scintillators in the radiation conversion layer to generate visible light photons. The visible light reaches the light shielding layer 02 and then is selected by the light shielding layer 02, a part of the visible light reaches the photoelectric conversion layer 01. The photoelectric conversion layer 01 converts visible light signals into electrical signals, thereby indirectly acquiring image information carried by the X-ray. The scintillator film or scintillator crystal includes scintillator or phosphors, such as cesium iodide (doped with Thallium) CsI(Tl), or CdWO4 or GOS (Gd2O2S:Pr).

FIG. 10 illustrates that the light emitting panel 04 indirectly provides the image sensor with incident light. That is, light La emitted by the light emitting panel 04 irradiates the object to be detected, turns into reflected light Lb carrying the image information after being reflected by the object, and then reaches the light shielding layer 02 through a certain path. At least a part of the reflected light Lb reaches the photoelectric conversion layer 01 through the light shielding layer 02.

For example, the light emitting panel 04 can include a visible light display panel. The visible light display panel is configured to display images, and at the same time, to emit the light La to illuminate a flat or three-dimensional object to be captured by the image detector. A light source of the visible light display panel illuminates uniformly the fingerprint surface characterized by many irregular ridges and valleys. When the finger is pressed on the transparent substrate B, the ridges contact the substrate B, and a certain air gap is created between the valley and the substrate B. Light reflectivity on an interface of any two materials is proportional to the square of difference between their refractive indexes. Therefore, stronger light reflection can be observed along the valleys of the fingerprint, while darker lines can be observed along the ridges of the fingerprint. In this way, the fingerprint image formed by the reflected light exhibits bright stripes at the valleys and dark stripes along the ridge. The fingerprint image is then formed by alternated bright and dark stripes.

In an embodiment of the present disclosure, the visible light display panel includes an OLED display, such as an organic light-emitting diode array display or an inorganic light-emitting diode array display, etc. In addition, the visible light display panel can also include a non-self-luminous display, such as a liquid crystal display or a projection display.

Figure 11:
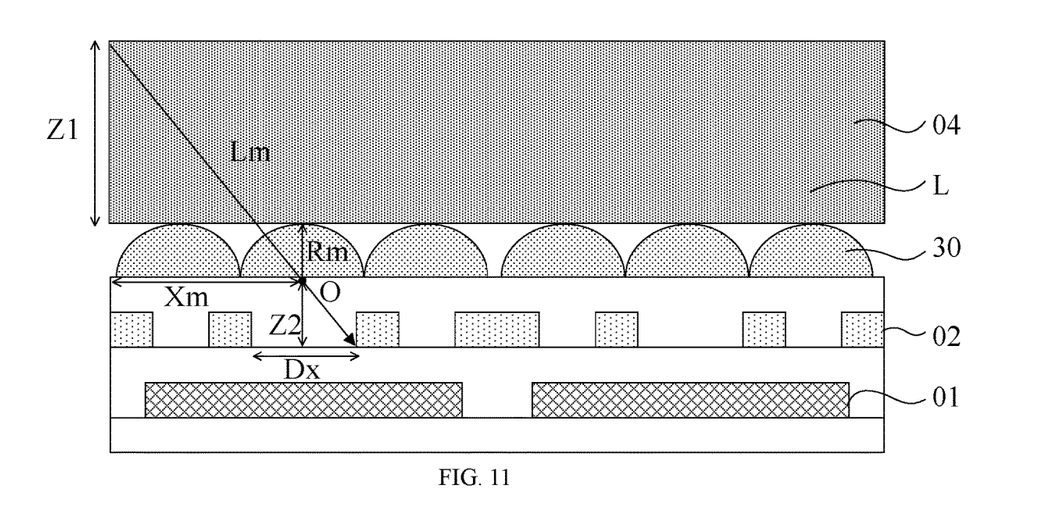
FIG. 11 is a schematic illustrating determining a diameter of an opening in an embodiment of the present disclosure.

The characteristic diameter of the opening 22 is described as below. FIG. 11 is a schematic illustrating determining a diameter of an opening according to an embodiment of the present disclosure. Referring to FIG. 11, it is assumed that the convex lens 30 is an ideal hemispherical lens and a center of sphere thereof is at point O1. The radiations radiating from the center of sphere in all angles exhibit an incidence angle of zero at a spherical surface of the lens without being refracted, and the same is true of reverse light. Lm represents the incident light having a maximum angle that can pass through the opening 22, the diameter Dx of the opening 22 can be determined by a path of this beam of light. With referent to FIG. 12, according to a concept of similar triangles, it can be obtained that:

$$\frac{D_x}{2 \cdot Z_2} = \frac{Xm}{Z_1 + R_m},$$

It can be further obtained from the above equation:

$$D_x = \frac{2 \cdot Z_2 \cdot X_m}{Z_1 + R_m},$$

where $Z_1$ represents a distance from center O of the convex lens 30 to the light emitting panel, $Z_2$ represents a distance from the center O of the convex lens 30 to the light shielding layer 02, Rm represents a curvature radius of the convex lens 30, and Xm represents a distance from the center O of the convex lens 30 to the border of the photosensitive pixel P.

A diameter or width DH of the convex lens 30 and the diameter DX of the corresponding opening 22 satisfy: 0.8DX<DH<1.5DX.

Figure 12:
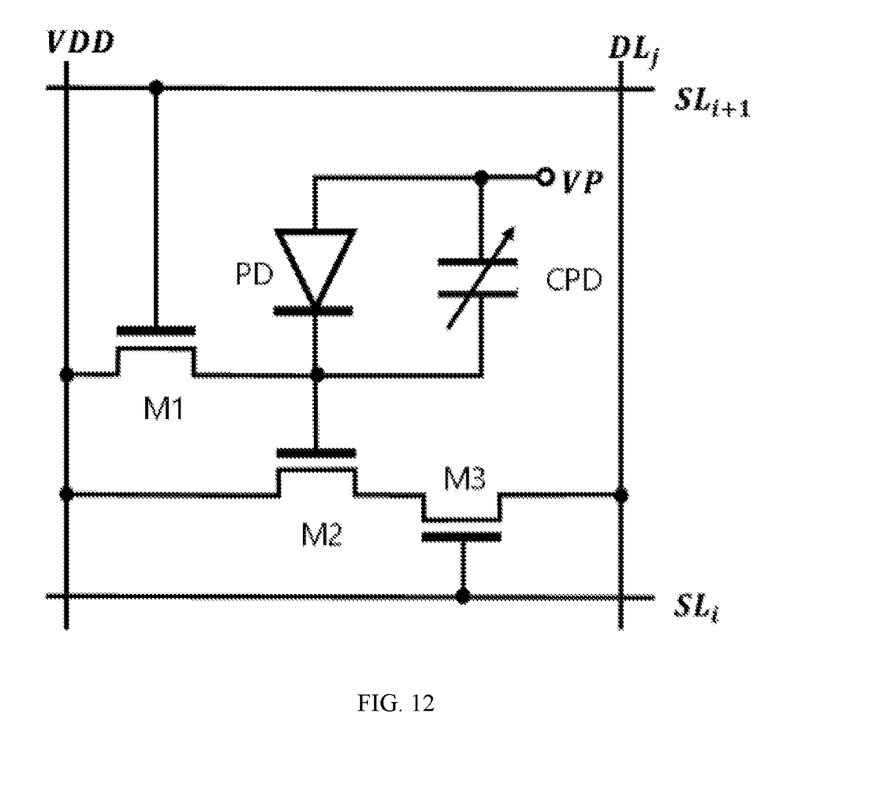
FIG. 12 is a schematic illustrating an amplification circuit of a radiation image detector provided in an embodiment of the present disclosure.

In an embodiment of the present disclosure, the photosensitive pixel further includes an amplification circuit configured to amplify signal charges and to output the amplified signal charges to an external circuit. FIG. 12 is a schematic illustrating an amplification circuit of a radiation image detector provided by an embodiment of the present disclosure. As shown in FIG. 12, the amplification circuit at least includes an amplification transistor M2, a reset transistor M1, and an output transistor M3. PD represents the photoelectric conversion layer 01 in the above various embodiments of the present disclosure, CPD represents an equivalent capacitance in the photoelectric conversion layer, and VP represents a voltage between upper and lower electrodes of the photoelectric conversion layer 01. A gate of the amplification transistor M2 is connected to a source of the reset transistor M1 and is directly or through other electrodes connected to the photoelectric conversion layer, a drain of the amplification transistor M2 is connected to a first voltage signal line VDD, the amplification transistor M2 is configured to convert collected photo-generated charges into signal voltage or signal current and output the signal voltage or the signal current to external circuit. A gate of the output transistor M3 is connected to an i-th scanning line SLi, a source of the output transistor M3 is electrically connected to a source of the amplification transistor M2, and a drain of the output transistor M3 is connected to a j-th data line DLj. When the output transistor M3 is turned on, the photo-generated charges collected by the amplification transistor M2 is converted into the signal voltage or the signal current, and the signal voltage or the signal current is output to the external circuit. A gate of the reset transistor M1 is connected to a (i+1)-th scanning line SL(i+1), a first electrode (e.g., a drain) of the reset transistor M1 is electrically connected to the gate of the amplification transistor M2, and a second electrode (e.g., a source) of the reset transistor M1 is electrically connected to the first voltage signal line VDD, and the reset transistor M1 periodically resets a potential of the gate of the amplification transistor M2.

The above detailed descriptions of the embodiments of the present invention set forth preferred modes contemplated by the inventors for carrying out the present invention at the time of filing this application, and are provided by way of examples and not as limitations. Accordingly, various modifications and variations obvious to a person of ordinary skill in the art to which it pertains are deemed to lie within the scope and spirit of the present invention as set forth in the following claims.

What is claimed is:

1. An image detector, comprising: a pixel array comprising a plurality of photosensitive pixels,
   wherein each of the plurality of photosensitive pixels comprises:
   a photoelectric conversion layer configured to convert incident light into signal charges; and
   a light shielding layer positioned at a side of the photoelectric conversion layer close to a light incident surface and comprising a plurality of openings to pass the incident light to the photoelectric conversion layer,
   wherein each of the plurality of openings has its light-passing area substantially proportional to a distance from the opening to a border of the photosensitive pixel.

2. The image detector according to claim 1, wherein each of the plurality of photosensitive pixels further comprises a lens array comprising a plurality of convex lenses and positioned at a side of the light shielding layer close to the light incident surface, and
   wherein each of the plurality of convex lenses is paired with one of the plurality of openings, and has its optical axis passing through the paired opening and perpendicular to the photoelectric conversion layer.

3. The image detector according to claim 2, wherein the plurality of openings comprises a central opening surrounded by at least one ring-shaped opening;
   wherein the plurality of convex lenses comprises a central convex lens surrounded by at least one ring-shaped convex lens.

4. The image detector according to claim 2, further comprising:
   a light emitting panel positioned at a side of the lens array close to the light incident surface and configured to provide illumination for the image detector.

5. The image detector according to claim 4, wherein the light emitting panel comprises a visible light display panel configured to illuminate a flat or three-dimensional object to be captured by the image detector.

6. The image detector according to claim 5, wherein the visible light display panel includes an Organic Light-Emitting Diode (OLED) display.

7. The image detector according to claim 4, wherein the light emitting panel comprises a radiation conversion layer configured to convert radiation into visible light.

8. The image detector according to claim 7, wherein the radiation conversion layer comprises a scintillator film or a scintillator crystal.

9. The image detector according to claim 4, wherein each of the plurality of convex lenses has its diameter DH, which satisfies: 0.8DX<DH<1.5DX, where $$DX = \frac{2 \cdot Z_2 \cdot X_m}{Z_1 + R_m},$$

and $Z_1$ represents a distance from center of the convex lens to the light emitting panel, $Z_2$ represents a distance from a center of the convex lens to the light shielding layer, Rm represents a curvature radius of the convex lens, and Xm represents a distance from the center of the convex lens to an edge of the photosensitive pixel.

10. The image detector according to claim 1, wherein each of the plurality of photosensitive pixels further comprises an amplification circuit configured to amplify the signal charges and to output the amplified signal charges to an external circuit; and
    wherein the amplification circuit comprises an amplification transistor, a reset transistor, and an output transistor.

* * * * *